(12) United States Patent
Wang et al.

(10) Patent No.: US 10,847,426 B2
(45) Date of Patent: Nov. 24, 2020

(54) FINFET DEVICES AND METHODS OF FORMING THE SAME

(71) Applicant: Taiwan Semiconductor Manufacturing Co., Ltd., Hsinchu (TW)

(72) Inventors: Chih-Hao Wang, Hsinchu County (TW); Jui-Chien Huang, Hsinchu (TW); Kuo-Cheng Ching, Hsinchu County (TW); Chun-Hsiung Lin, Hsinchu County (TW); Pei-Hsun Wang, Kaohsiung (TW)

(73) Assignee: Taiwan Semicondutor Manufacturing Company, Ltd., Hsinchu (TW)

( * ) Notice: Subject to any disclaimer, the term of this patent is extended or adjusted under 35 U.S.C. 154(b) by 97 days.

(21) Appl. No.: 16/172,848

(22) Filed: Oct. 28, 2018

(65) Prior Publication Data
US 2020/0135584 A1 Apr. 30, 2020

(51) Int. Cl.
| | |
|---|---|
| *H01L 21/70* | (2006.01) |
| *H01L 21/8238* | (2006.01) |
| *H01L 27/092* | (2006.01) |
| *H01L 29/06* | (2006.01) |
| *H01L 29/10* | (2006.01) |
| *H01L 29/16* | (2006.01) |
| *H01L 21/324* | (2006.01) |
| *H01L 21/02* | (2006.01) |
| *H01L 29/161* | (2006.01) |

(52) U.S. Cl.
CPC ........ *H01L 21/823807* (2013.01); *H01L 21/02532* (2013.01); *H01L 21/02614* (2013.01); *H01L 21/324* (2013.01); *H01L 21/823821* (2013.01); *H01L 21/823878* (2013.01); *H01L 27/0924* (2013.01); *H01L 29/0649* (2013.01); *H01L 29/1054* (2013.01); *H01L 29/16* (2013.01); *H01L 29/161* (2013.01)

(58) Field of Classification Search
CPC ........ H01L 21/02532; H01L 21/02614; H01L 21/324; H01L 21/7624; H01L 21/765; H01L 21/823431; H01L 21/823807; H01L 21/823821; H01L 21/823842; H01L 21/823878; H01L 27/0924; H01L 29/0649; H01L 29/1054; H01L 29/16; H01L 29/161; H01L 29/515; H01L 29/66787; H01L 29/66818
USPC .......................................... 257/369
See application file for complete search history.

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |

(Continued)

*Primary Examiner* — Brook Kebede
(74) *Attorney, Agent, or Firm* — JCIPRNET

(57) ABSTRACT

Provided are FinFET devices and methods of forming the same. A FinFET device includes a substrate, a first gate strip and a second gate strip. The substrate has at least one first fin in a first region, at least one second fin in a second region and an isolation layer covering lower portions of the first and second fins. The first fin includes a first material layer and a second material layer over the first material layer, and the interface between the first material layer and the second material layer is uneven. The first gate strip is disposed across the first fin. The second gate strip is disposed across the second fin.

20 Claims, 11 Drawing Sheets

(56) References Cited

U.S. PATENT DOCUMENTS

| | | |
|---|---|---|
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 9,984,937 B1 * | 5/2018 | Bi .................. H01L 21/823412 |
| 2019/0214306 A1 * | 7/2019 | Chen .................. H01L 29/0653 |

* cited by examiner

FINFET DEVICES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
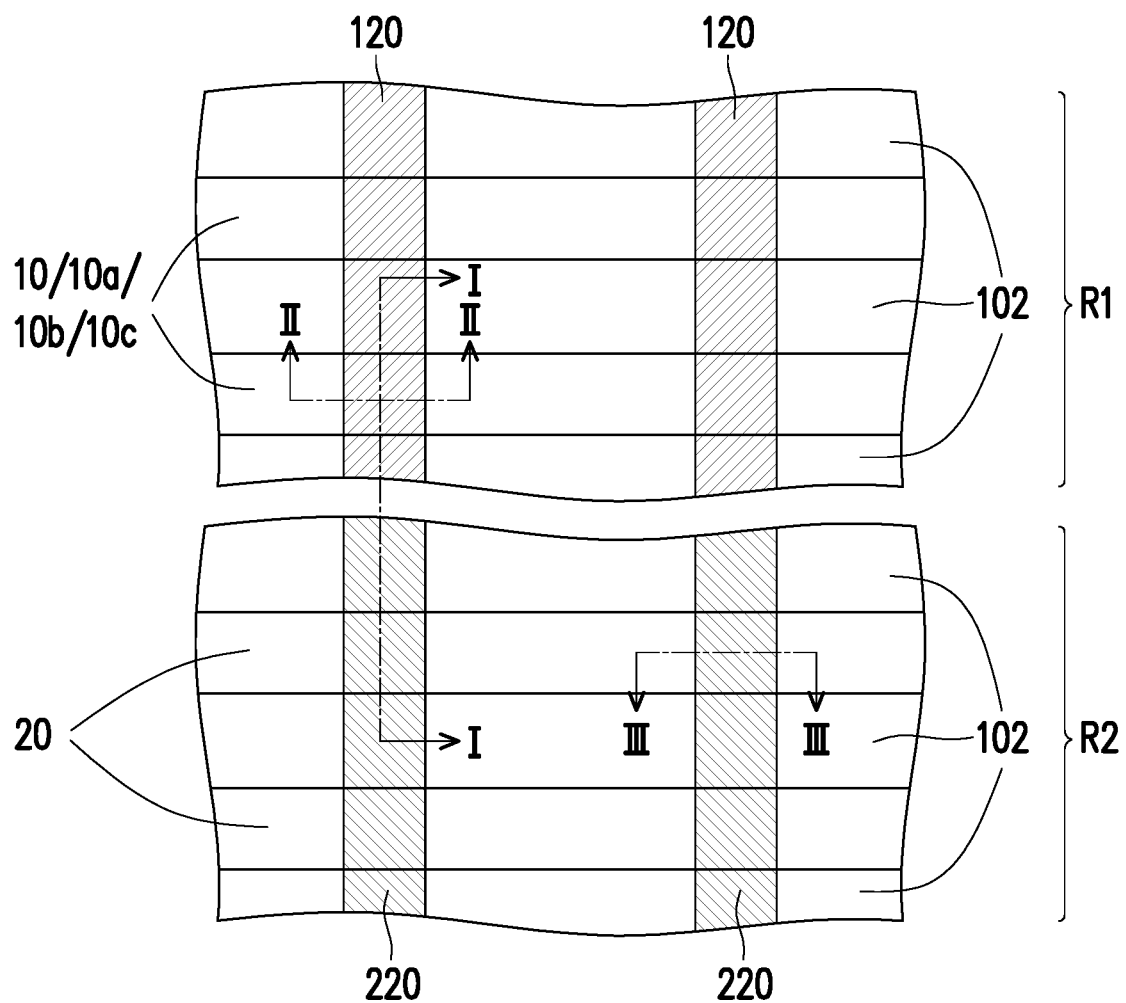
FIG. 1 is a simplified top view of a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a simplified top view of a FinFET device in accordance with some embodiments, in which few elements such as fins, an isolation layer and gate strips are shown for simplicity and clarity of illustration. FIG. 2A to FIG. 2G are schematic cross-sectional views of a method of forming a FinFET device in accordance with some embodiments, some of which are taken along the line I-I, line II-II and/or line of FIG. 1.

Figure 2A:
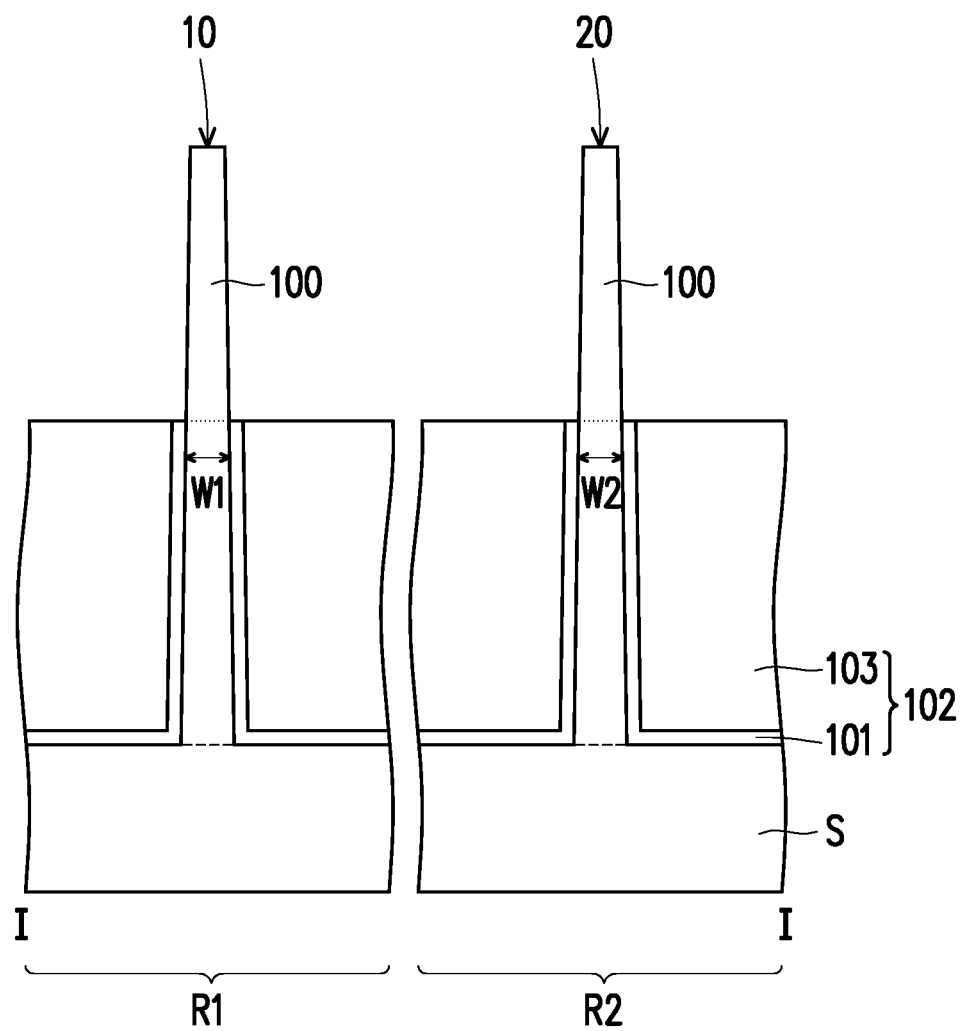
FIG. 2A to FIG. 2G are schematic cross-sectional views of a method of forming a FinFET device in accordance with some embodiments.

Referring to FIG. 1 and FIG. 2A, a substrate S is provided. In some embodiments, the substrate S has one or more first fins 10 in a first region R1 and one or more second fins 20 in a second region R2. The first fins 10 and the second fins 20 may be arranged in parallel and extend in a direction. In some embodiments, the substrate S includes a silicon-containing substrate, a silicon-on-insulator (SOI) substrate, or a substrate formed of other suitable semiconductor materials. The substrate S, the first fins 10 and the second fins 20 may be made by the same material such as silicon. In some embodiments, the first region R1 is a P-type device region configured for a P-type FinFET device, and the second region R2 is an N-type device region configured for an N-type FinFET device. Depending on the requirements of design, the substrate S may have doped regions therein. The doped regions may be configured for a P-type FinFET device or an N-type FinFET device. The first fins 10 and the second fins 20 may protrude upwardly from the surface of the substrate S. In some embodiments, the first fins 10 and the second fins 20 have inclined sidewalls. In alternative embodiments, at least one of the first fins 10 and the second fins 20 has a substantially vertical sidewall.

In some embodiments, the substrate S further has an isolation layer 102 formed thereon. Specifically, the isolation layer 102 covers lower portions of the first fins 10 and the second fins 20 and exposes upper portions of the first fins 10 and the second fins 20. In some embodiments, the first fins 10 have a width W1, and the second fins 20 have a width W2. In some embodiments, a width is defined as an average width of a bottom width and a top width of the fin. In some embodiments, a width is defined as a width measured at a half-height position of the height of the fin. In some embodiments, a width is defined as a width of the fin measured at the level substantially the same as the surface of the adjacent isolation layer. In some embodiments, the width W1 is substantially the same as the width W2, but the disclosure is not limited thereto. In alternative embodiments, the width W1 may be different from the width W2.

In some embodiments, the isolation layer 102 is a shallow trench isolation (STI) structure. In some embodiments, the isolation layer 102 includes an oxide region 103 and a dielectric liner 101 between the oxide region 103 and the substrate S. In some embodiments, the dielectric liner 101 includes an oxide-containing material such as silicon oxide, silicon oxynitride or the like. In alternative embodiments, the dielectric liner 101 includes an oxide-free material such as silicon nitride, silicon carbon nitride or the like. In some embodiments, the oxide region 103 includes an oxide-containing material such as silicon oxide. In some embodiments, the isolation layer 102 has a substantially planar top surface. In alternative embodiments, the isolation layer 102 is recessed relative to the top surface of the adjacent first fins 10 or second fins 20.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, each of the substrate S, the first fins 10 and the second fins 20 includes a first material 100. The first material is referred to as a first material layer in some examples of the disclosure. In some embodiments, the first material 100 includes silicon. In some embodiments, the substrate S, the first fins 10 and the second fins 20 may be made by the same material such as silicon.

Figure 2B:
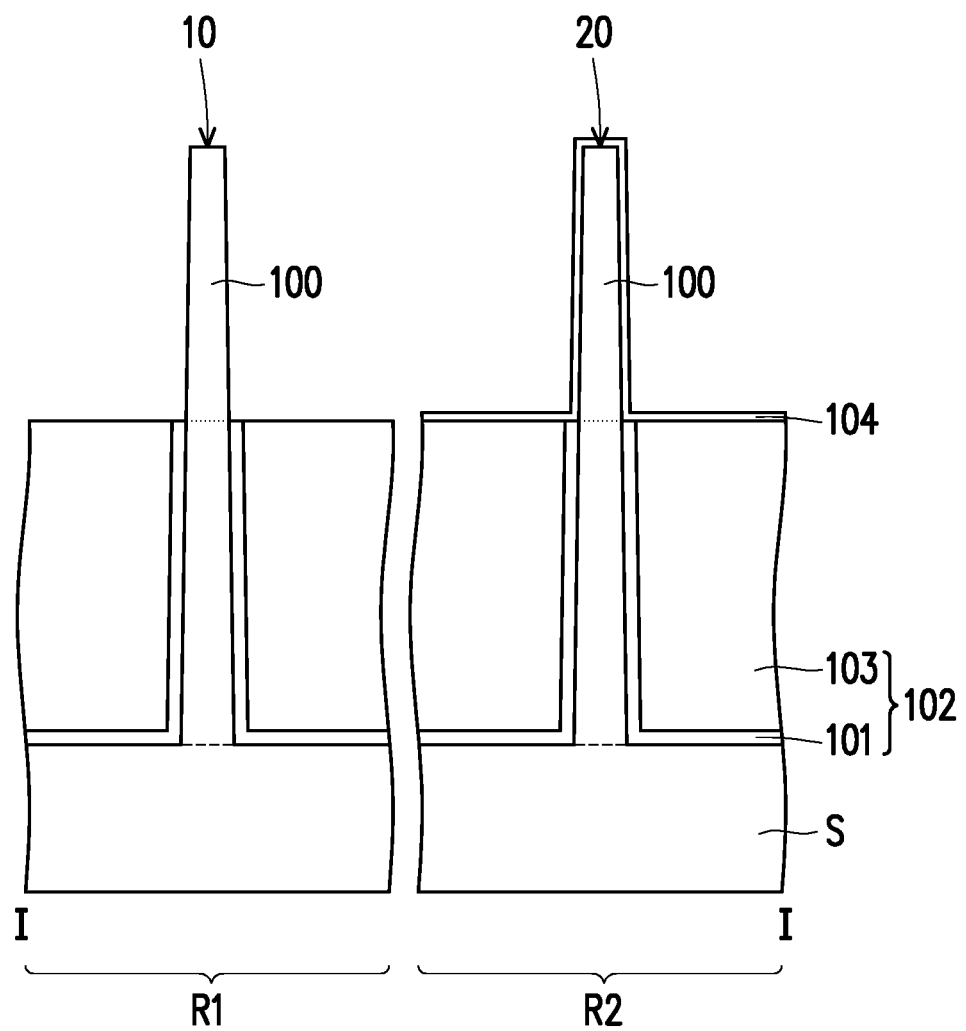

Referring to FIG. 2B, a mask layer 104 is formed on the surfaces of the second fins 20 in the second region R2. In some embodiments, the mask layer 104 is blanket-formed over the second region R2, covering the tops and sidewalls of the second fins 20 and the top surface of the isolation layer 102. In some embodiments, the mask layer 104 includes SiN, SiC, SiCN, SiON, SiCON, a combination thereof or the like, and is formed by a suitable deposition technique such as chemical vapor deposition (CVD), plasma-enhanced CVD (PECVD), atomic layer deposition (ALD), remote plasma ALD (RPALD), plasma-enhanced ALD (PEALD), a combination thereof or the like.

Figure 2C:
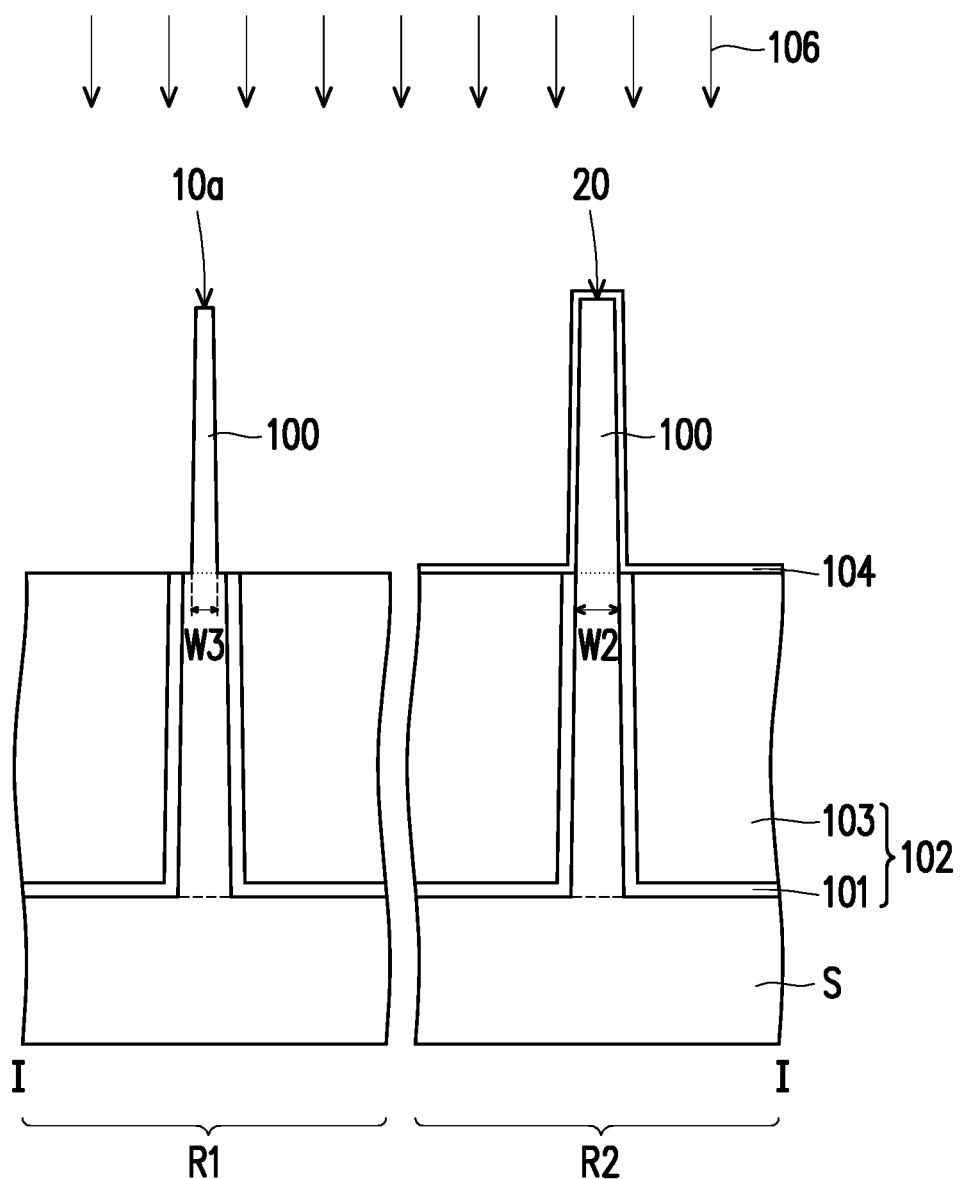

Referring to FIG. 2C, a trimming process 106 is optionally performed to narrow the width of the first fins 10. In some embodiments, the trimming process 106 is preformed to the first fins 10 by using the mask layer 104 as a mask. In some embodiments, the trimming process 106 includes performing an etching process such as a dry etching. Upon the trimming process 106, the trimmed first fins are referred to as first fins 10a. In some embodiments, the trimmed first fins 10a have a width W3, and the width W3 is less than the width W1 of the untrimmed first fins 10 or the width W2 of the second fins 20.

Figure 2D:
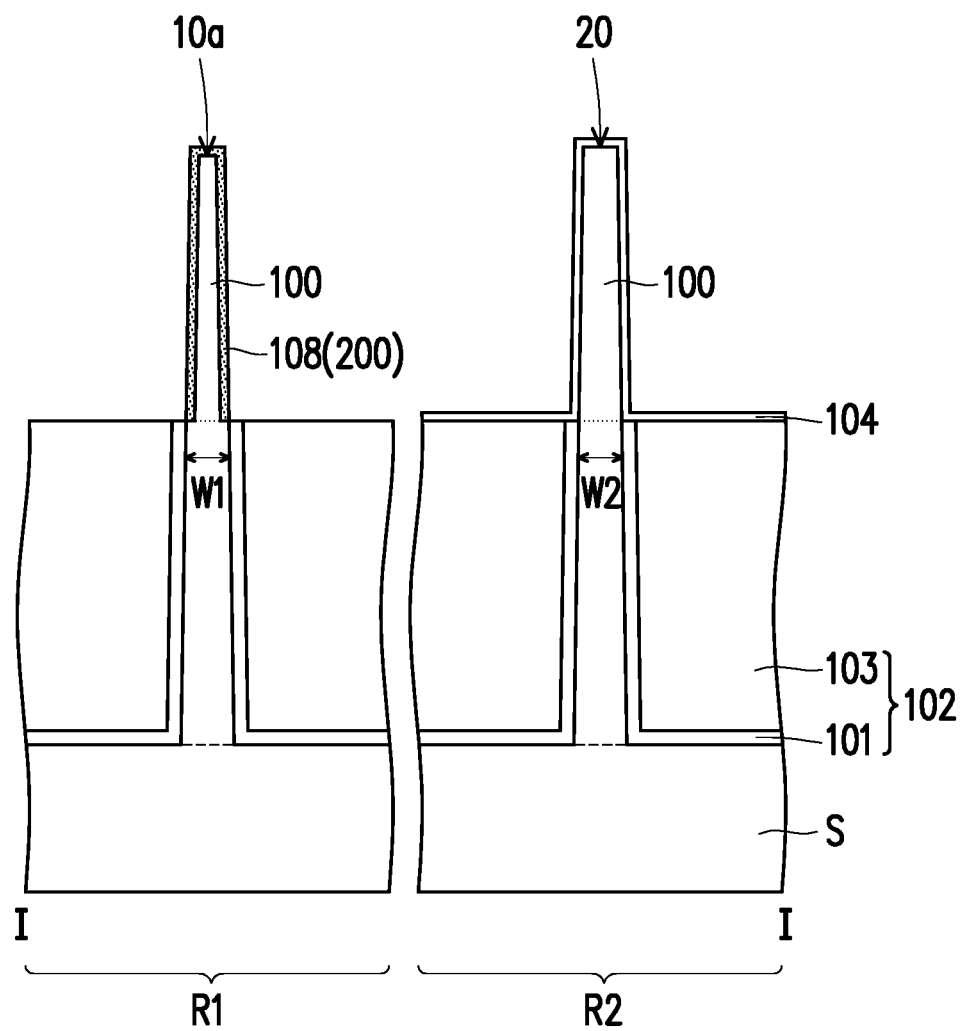

Referring to FIG. 2D, a transforming layer 108 is formed on the surfaces of the first fins 10b in the first region R1. In some embodiments, the transforming layer 108 includes a second material 200 different from the first material 100 of the first fins 10a. The second material is referred to as a second material layer in some examples of the disclosure. In some embodiments, the transforming layer 108 is a germanium-based semiconductor layer including germanium or silicon germanium. In some embodiments, the transforming layer 108 is formed through a selective epitaxial growth (SEG) process. In the selective epitaxial growth of germanium or silicon germanium, growth occurs on the exposed areas not covered by the mask layer 104, and thus, the germanium-based transforming layer 108 is formed on the surfaces of the first fins by using the first fins 10a as seeds. In alternative embodiments, the transforming layer 108 is formed by a suitable deposition technique such as CVD, physical vapor deposition (PVD), ALD, a combination thereof or the like. In some embodiments, the transforming layer 108 and the corresponding underlying first fin 10a have a total width W1.

Figure 2E:
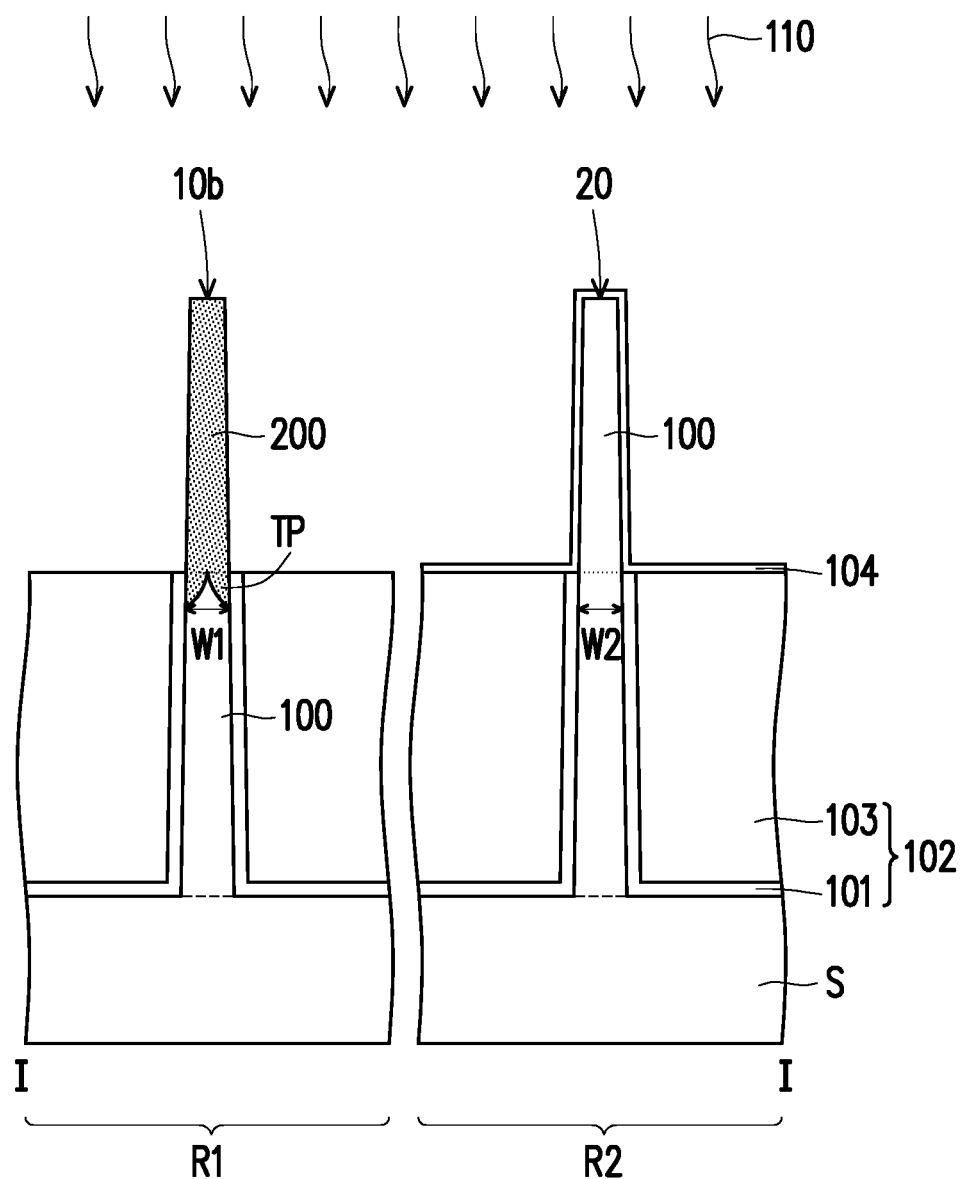

Referring to FIG. 2E, the second material 200 of the transforming layer 108 is driven into the underlying first fins 10a. In some embodiments, the second material 200 includes stress atoms such as germanium atoms. In some embodiments, germanium atoms of the transforming layer 108 are driven into underlying first fins 10a, so the silicon-based first fins 10a are transformed into germanium-based first fins 10b. In some embodiments, an annealing process 110 is performed to drive the second material 200 (e.g., silicon germanium) of the transforming layer 108 into the underlying first fins 10a. The annealing process 110 may include a high-temperature oxidation, a rapid thermal annealing (RTA) or a laser annealing. The annealing process 110 may be conducted at a temperature of about 600 to 1,100° C. Upon the annealing process 110, the annealed first fins are referred to as first fins 10b. In some embodiments, the annealed first fins 10b have a width W1 substantially the same as the width W2 of the second fins 20.

In some embodiments, the second material 200 (e.g., silicon germanium) is gradually driven from the surface to the inside of each first fin, so the stress atom concentration (e.g., germanium concentration) is gradually decreased from the surface to the inside of the first fin. In some embodiments, the second material 200 is further driven toward the isolation layer 102. Specifically, upon the annealing process 110, the second material 200 is driven to have two tailing portions TP in contact with the isolation layer 102. In some embodiments, the tailing portions TP of each of the first fins 10b are connected to each other. In some embodiments, when the second material 200 is silicon germanium, the germanium concentration of each first fin 10b above the isolation layer 102 (e.g., the germanium concentration of the upper first fin) is substantially constant and the germanium concentration of each first fin 10b below the isolation layer 102 (e.g., the germanium concentration of the tailing portions) is gradually decreased from the upper first fin to the substrate S. In alternative embodiments, each of the upper first fin and the tailing portions has a gradient germanium concentration.

Figure 2F:
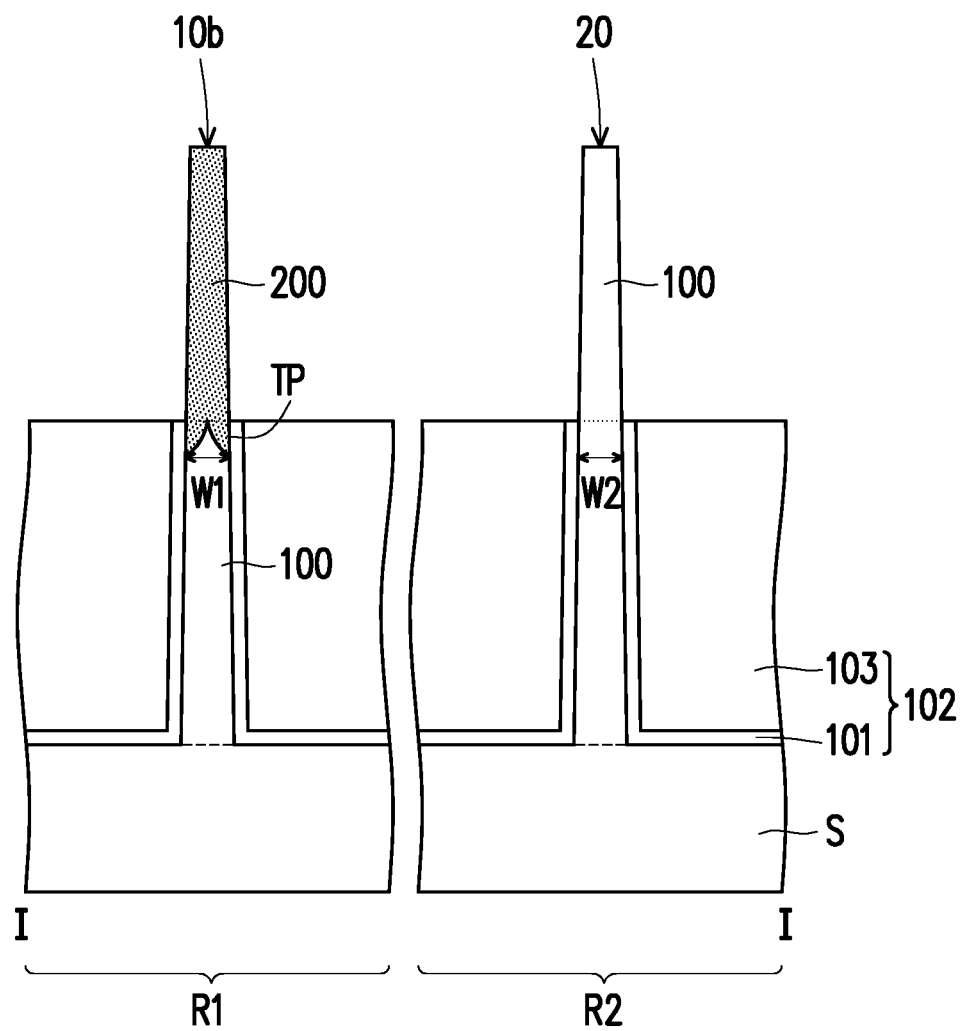

Referring to FIG. 2F, the mask layer 104 is removed from the second region R2. Specifically, the mask layer 104 is configured to protect the second fins 20 from being transformed when the silicon-based first fins 10a are transformed into germanium-based first fins 10b. After the silicon-based first fins 10a are transformed into germanium-based first fins 10b, the mask layer 104 is removed by an etching process.

Figure 2G:
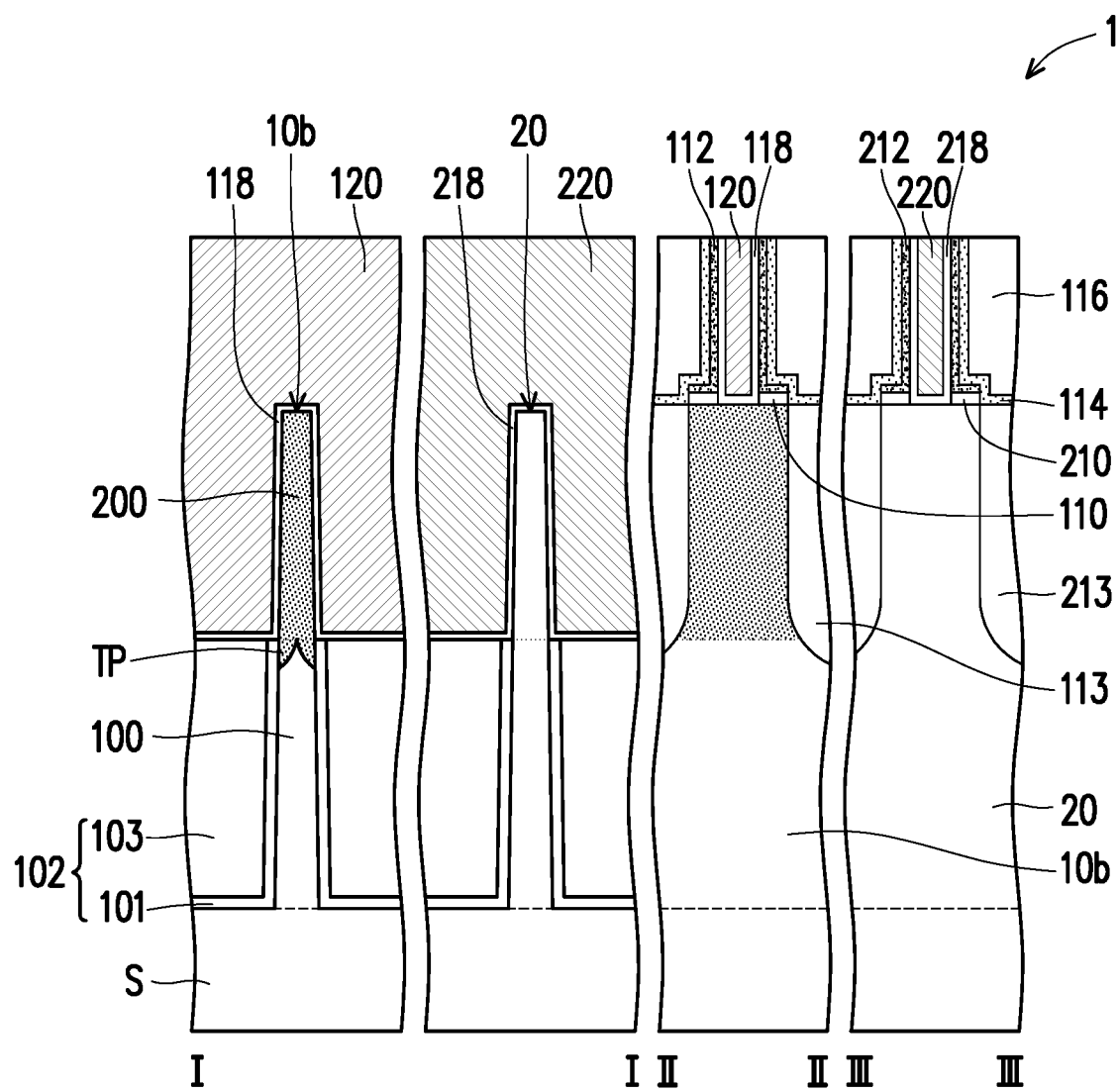

Referring to FIG. 1 and FIG. 2G, one or more first gate strips 120 and one or more second gate strips 220 are respectively formed across the first fins 10b and the second fins 20. In some embodiments, first and second dummy gate strips are formed and then replaced by the first and second gate strips 120 and 220. The first and second gate strips 120 and 220 are referred to as first and second metal gate stacks or replacement gate stacks in some examples of the disclosure. In some embodiments, the first and second gate strips 120 and 220 are respectively formed in the first and second regions R1 and R2. The first and second gate strips 120 and 220 may be arranged in parallel and extend in a direction different from (e.g., perpendicular to) the extending direction of the first and second fins. In some embodiments, the facing ends of the first gate strips 120 are aligned with the facing ends of the second gate strips 220.

In some embodiments, the first and second dummy gate strips are formed across the first fins 10b and the second fins 20 respectively in the first and second regions R1 and R2. The first and second dummy gate strips may be polysilicon strips. In some embodiments, the first and second dummy gate strips may respectively have first and second gate spacers 112 and 212 on opposing sidewalls thereof. The first and second gate spacers 112 and 212 may include a low-k material having a dielectric constant less than about 4 or less than about 3.5. The first and second gate spacers 112 and 212 may have a single-layer or multi-layer structure. In some embodiments, first interfacial layers 110 are respectively formed between the first fins 10b and the first gate spacers 112, and second interfacial layers 210 are respectively formed between the second fins 20 and the second gate spacers 212. The first and second interfacial layers 110 and 210 may include silicon oxide or silicon oxynitride.

In some embodiments, first strained layers (source-drain EPI layer) 113 are formed in the first fins 10b aside the first dummy gate strips, and second strained layers (source-drain EPI layers) 213 are formed in the second fins 20 aside the second dummy gate strips. In some embodiments, the first strained layers 113 include silicon germanium (SiGe/SiGe: B) for a P-type FinFET device, and the second strained layers 213 include silicon carbon (SiC), silicon phosphate (SiP), SiCP or a SiC/SiP multi-layer structure for an N-type FinFET device. In some embodiments, a dielectric layer 116 is formed over the substrate S aside or around the first and second dummy gate strips. The dielectric layer 116 may include oxide such as silicon oxide, phosphosilicate glass (PSG), borosilicate glass (BSG), boron-doped phosphosilicate glass (BPSG), a combination thereof or the like. In some embodiments, an etch stop layer 114 is formed after the operation of forming the first and second strained layers 113 and 213 and before the operation of forming the dielectric layer 116. In some embodiments, the etch stop layer 114 includes SiN, SiC or the like.

In some embodiments, the first and second dummy gate strips are removed, so as to form first and second gate trenches respectively in the first and second regions R1 and R2. In some embodiments, first and second gate strips 120 and 220 are respectively formed in the first and second gate trenches. In some embodiments, each of the first gate strips 120 includes a P-type work function metal layer to provide a gate electrode that properly performs in a P-type FinFET device. The P-type work function metal layer may include TiN, WN, TaN, conductive metal oxide, and/or a suitable material. In some embodiments, each of the second gate strips 220 includes an N-type work function metal layer to provide a gate electrode that properly performs in an N-type FinFET device. The N-type work function metal layer may include TiAl, TiAlN, or TaCN, conductive metal oxide, and/or a suitable material. In some embodiments, each of the first and second gate strips 120 and 220 may further include a fill metal layer. The fill metal layer includes copper (Cu), aluminum (Al), tungsten (W), or a suitable material. In some embodiments, each of the first and second gate strips 120 and 220 may further include a liner layer, an interface layer, a seed layer, an adhesion layer, a barrier layer, a combination thereof or the like.

In some embodiments, first and second gate dielectric layers 118 and 218 are formed in the first and second gate trenches before the operation of forming the first and second gate strips 120 and 220. Each of the first and second gate dielectric layers 118 and 218 may include a high-k material having a dielectric constant greater than about 10. In some embodiments, the high-k material includes metal oxide, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, a combination thereof, or a suitable material. In alternative embodiments, each of the first and second gate dielectric layers 118 and 218 may optionally include a silicate such as HfSiO, LaSiO, AlSiO, a combination thereof, or a suitable material. The FinFET device 1 of the disclosure is thus completed with the described process operations. However, it is not limited to add one or more additional operations among the above operations for fabricating the FinFET device. The FinFET device 1 of the disclosure is a dual-channel FinFET device.

In the above embodiments, the trimming process 106 (labelled in FIG. 2C) is performed before the transforming process (including forming a transforming layer 108 in FIG. 2D and performing an annealing process 110 in FIG. 2E), so the resulting first fins 10b have a size substantially the same as the original size of the first fins 10. However, the present disclosure is not limited thereto. In alternative embodiments, the trimming process may be performed after the transforming process. Specifically, a transforming process is performed to the first fins, and a trimming process is performed to trim the first fins to the desired size.

Figure 3A:
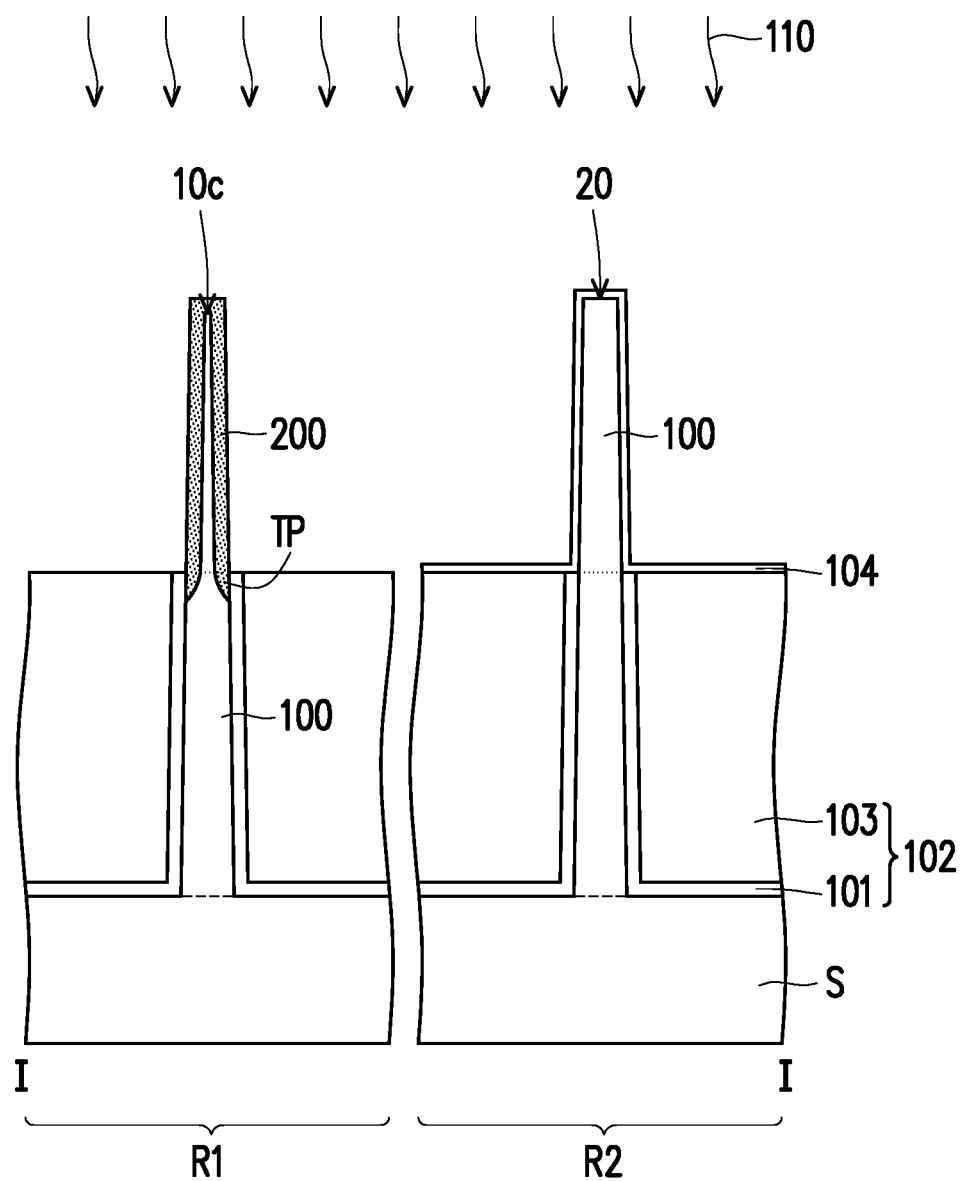
FIG. 3A to FIG. 3B are schematic cross-sectional views of a method of forming a FinFET device in accordance with alternative embodiments.
Figure 3B:
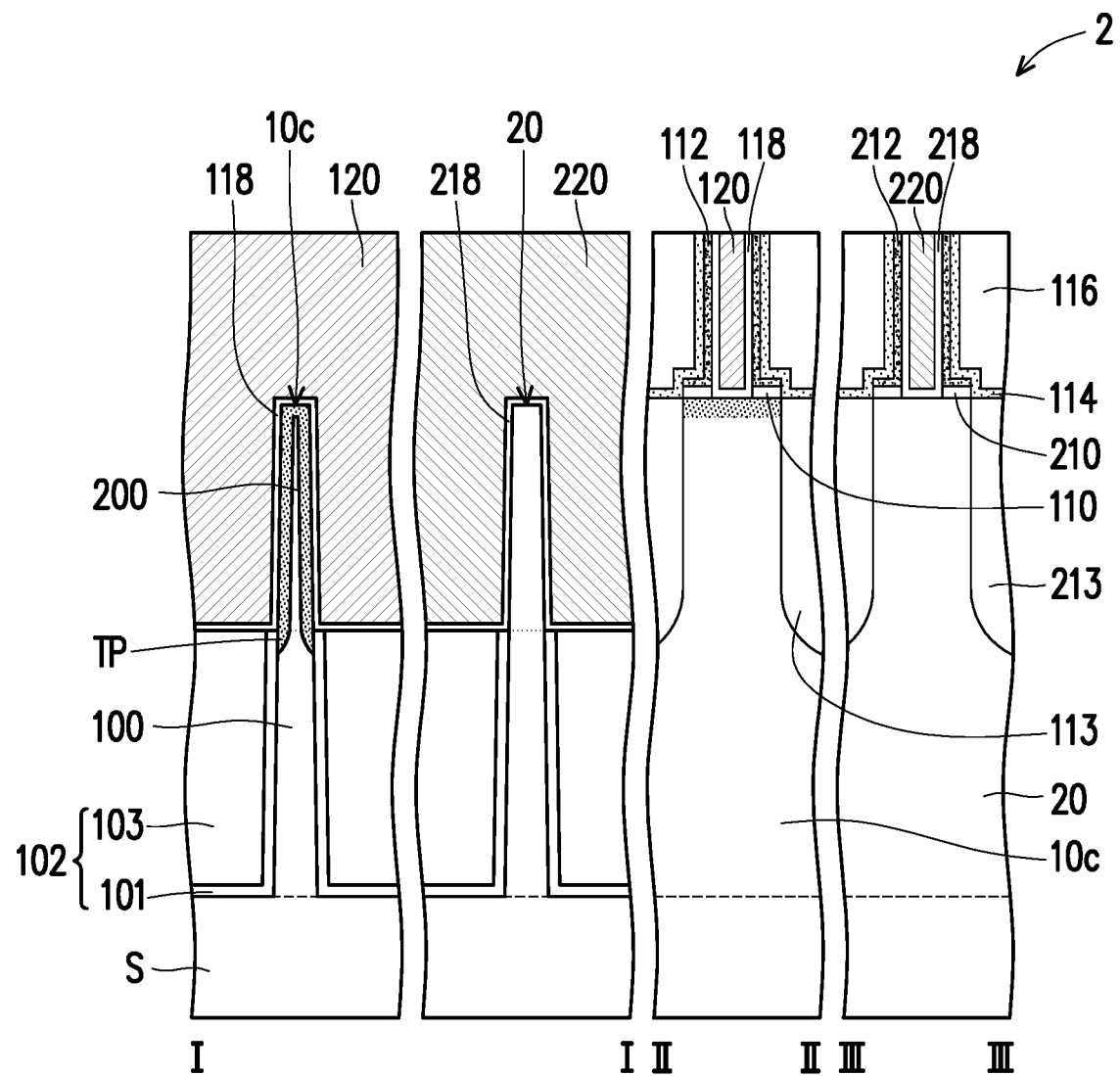

FIG. 3A to FIG. 3B are schematic cross-sectional views of a method of forming a FinFET device in accordance with alternative embodiments. The process flow of the FIG. 3A to FIG. 3B is similar to the process flow of FIG. 2A to FIG. 2G, so the difference between them is illustrated in the following, and the similarity is not iterated herein.

Operations similar to the operations described in FIGS. 2A-2D are performed, so as to provide an intermediate structure as shown in FIG. 2D. Thereafter, as shown in FIG. 3A, the second material 200 of the transforming layer 108 is driven into the underlying first fins. In some embodiments, the second material 200 includes germanium and silicon germanium. In some embodiments, germanium atoms of the transforming layer 108 are driven into underlying first fins 10a, so the silicon-based first fins 10a are transformed into germanium-based first fins 10b. In some embodiments, an annealing process 110 is performed to drive the second material 200 (e.g., silicon germanium) of the transforming layer 108 into the underlying first fins 10a. The annealing process 110 may include a high-temperature oxidation, a rapid thermal annealing (RTA) or a laser annealing. The annealing process 110 may be conducted at a temperature of about 600 to 900° C. Upon the annealing process 110, the annealed first fins are referred to as first fins 10c. In some embodiments, the annealed first fins 10c have a width W1 substantially the same as the width W2 of the second fins 20.

In some embodiments, the second material 200 (e.g., silicon germanium) is gradually driven from the surface to the inside of each first fin, so the stress atom concentration (e.g., germanium concentration) is gradually decreased from the surface to the inside of the first fins. In some embodiments, the center portion of each first fin 10c above the isolation layer 102 is free of the second material 200. Specifically, the center portion of each first fin 10c above the isolation layer 102 is made by silicon, and the periphery portion of the first fin 10c above the isolation layer 102 is made by silicon germanium.

In some embodiments, the second material 200 is further driven toward the isolation layer 102. Specifically, upon the annealing process 110, the second material 200 is driven to have two tailing portions TP in contact with the isolation layer 102. In some embodiments, the tailing portions TP of each of the first fins 10c are separated from each other. In some embodiments, when the second material 200 is silicon germanium, the germanium concentration of each first fin 10c above the isolation layer 102 (e.g., the germanium concentration of the upper first fin) is gradually reduced from the outside to the inside of the first fin, and the germanium concentration of each first fin 10c below the isolation layer 102 (e.g., the germanium concentration of the tailing portions) is gradually decreased from the upper to the lower of the first fin.

Thereafter, an operation similar to the operation described in FIG. 2G is performed, so as to form a FinFET device 2 as shown in FIG. 3B. The FinFET device 2 of the disclosure is a dual-channel FinFET device.

Figure 4:
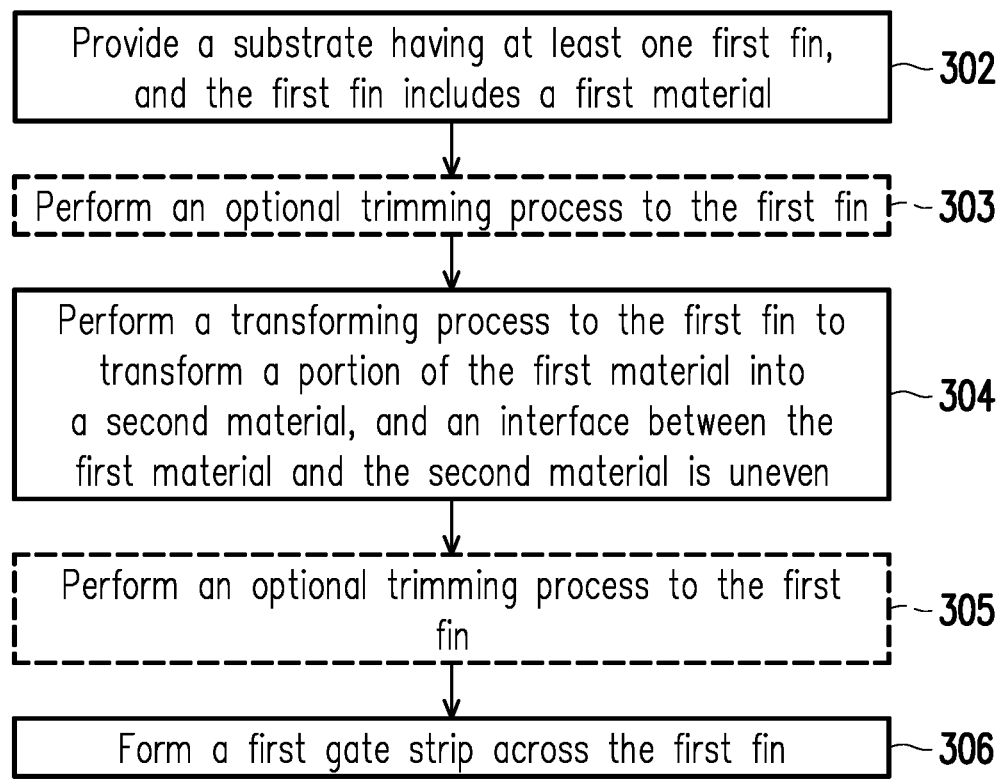
FIG. 4 is a flow chart illustrating a method of forming a FinFET in accordance with some embodiments.

The process operations of forming the first fins in FIG. 2A to FIG. 2G and FIG. 3A to FIG. 3B may be illustrated with a process flow of FIG. 4.

At block 302, a substrate S is provided with at least one first fin 10, and the first fin 10 includes a first material 100, as shown in FIG. 2A. In some embodiments, the first fin 10 is a fin configured for a P-type FinFET device.

At block 304, a transforming process is performed to the first fin 10 to transform a portion of the first material 100 into a second material 200. In some embodiments, the interface between the first material 100 and the second material 200 of the transformed first fins 10b/10c is uneven, as shown in FIG. 2B to FIG. 2F and FIG. 3A.

In some embodiments, the transforming process includes the following operation. A transforming layer 108 including the second material 200 is formed on the surface of the first fin, as shown in FIG. 2D. An annealing process 110 is performed to drive the second material 200 into the first fin, as shown in FIG. 2E.

In some embodiments, the first material 100 of the first fin above an isolation layer 102 is completely transformed into the second material 200, as shown in FIG. 2E. Specifically, the first material 100 of the first fin 10b has a tapered top portion at a level not higher than the top surface of the isolation layer 102, and the remaining portion of the first fin 10b is made by the second material 200.

In alternative embodiments, the first material 100 of the first fin above an isolation layer 102 is partially transformed into the second material 200, as shown in FIG. 3A. Specifically, the first material 100 of the first fin 10c has a tapered top portion at a level higher than the top surface of the isolation layer 102, and the second material 200 surrounds the tapered top portion.

In some embodiments, the second material 200 of the transforming layer 108 is further driven toward the isolation layer 102. In some embodiments, the second material 200 has two tailing portions TP in contact with the isolation layer 102.

In some embodiments, a trimming process 106 in block 303 is optionally performed to narrow a width of the first fin before the transforming process, as shown in FIG. 2E. However, the present disclosure is not limited thereto. In alternative embodiments, the trimming process in block 305 is optionally performed after the transforming process, so as to trim the first fin to the desired size. In yet alternative embodiments, two trimming processes in block 303 and block 305 are both performed as needed. In still alternative embodiments, two trimming processes in block 303 and block 305 are both omitted as needed.

At block 306, a first gate strip 120 is formed across the first fin 10b/10c, as shown in FIG. 2G and FIG. 3B. In some embodiments, the first gate strip 120 is a gate strip configured for a P-type FinFET device.

The structures of the FinFET devices of the disclosure are described below with reference to FIG. 2G and FIG. 3B.

In some embodiments, the FinFET device 1/2 of the disclosure includes a substrate S, a first gate strip 120 and a second gate strip 220. The substrate S has at least one first fin 10b/10c in a first region R1, at least one second fin 20 in a second region R2, and an isolation layer 102 covering lower portions of the first fin 10b/10c and the second fin 20. In some embodiments, the first region R1 is a P-type device region, and the second region R2 is an N-type device region. In some embodiments, the first fin 10b/10c includes a first material layer 100 and a second material layer 200 over the first material layer 100, and the interface between the first material layer 100 and the second material layer 200 is uneven or non-flat. In some embodiments, the first material layer 100 includes silicon, and the second material layer 200 includes silicon germanium. The first gate strip 120 is disposed across the first fin 10b/10c. The second gate strip 220 is disposed across the second fin 20.

In some embodiments, the second material layer 200 has a tailing profile toward the isolation layer 102. Specifically, the tailing portions TP of the second material 200 are tapered downwardly toward the substrate S. In some embodiments, the second material layer 200 has two tailing portions TP in contact with the isolation layer 102.

In some embodiments, the first fin 10b above the isolation layer 102 is constituted by the second material layer 200, as shown in FIG. 2G. In alternative embodiments, the first fin 10c above the isolation layer 102 is constituted by the second material layer 200 surrounding the first material layer 100, as shown in FIG. 3B.

From another point of view, the upper first fin 10c includes the first material layer 100 and the second material layer 200, while the upper first fin 10b merely includes the first material layer 100. An upper first fin is defined as the upper portion of the fin above the surface of the adjacent isolation layer.

In some embodiments, the second material layer 200 has a uniform germanium concentration within the first fin 10b above the isolation layer 102. In some embodiments, the second material layer 200 has a gradient germanium concentration within the first fin 10c above the isolation layer 102.

The above embodiments in which each of the gate dielectric layers, the gate strips, the gate spacers and the dielectric layer etc. is a single layer are provided for illustration purposes, and are not construed as limiting the present disclosure. In some embodiments, at least one of these described components may be a multi-layer structure as needed.

In the above-mentioned embodiments, a "high-k last" metal gate process is implemented to form a FinFET device. However, another process such as a "high-k first" metal gate process o may be applied by using similar processes as described herein. The methods disclosed herein may be easily integrated with a CMOS process flow and do not require additional complicated operations to achieve the desired results. It is understood that embodiments disclosed herein offer different advantages, and that no particular advantage is necessarily required for all embodiments.

For a conventional dual-channel FinFET device, an isolation layer is formed after the silicon fins and the silicon germanium fins are formed, so silicon nitride liners are required to protect the silicon fins and the silicon germanium fins from being damaged during the formation of the isolation layer. Besides, the fin widths and/or fin profiles of the conventional dual-channel FinFET device in different regions are difficult to control due to different etching rates between silicon and silicon germanium, and therefore, the device performance is degraded. However, such issue is not observed in the present disclosure. Specifically, in some embodiments of the disclosure, a dual-channel FinFET device is easily manufactured by silicon germanium deposition and drive-in annealing after the formation of the isolation layer, so the conventional fin liner is not required. Besides, with the method of the disclosure, the germanium concentration and distribution of the silicon germanium fins is adjustable for Vt tuning. In some embodiments of the disclosure, the silicon fins and the silicon germanium fins in different regions are formed with desired shapes and sizes. Therefore, the performance and reliability of the device is accordingly improved.

In accordance with some embodiments of the present disclosure, a FinFET device includes a substrate, a first gate strip and a second gate strip. The substrate has at least one first fin in a first region, at least one second fin in a second region and an isolation layer covering lower portions of the first and second fins. The first fin includes a first material layer and a second material layer over the first material layer, and the interface between the first material layer and the second material layer is uneven. The first gate strip is disposed across the first fin. The second gate strip is disposed across the second fin.

In accordance with alternative embodiments of the present disclosure, a method of forming a FinFET device that includes the following operations. A substrate is provided with at least one first fin, and the first fin includes a first material. A transforming process is performed to the first fin to transform a portion of the first material into a second material, and an interface between the first material and the second material is uneven. A first gate strip is formed across the first fin.

In accordance with yet alternative embodiments of the present disclosure, a method of forming a FinFET device that includes the following operations. A substrate is provided with at least one first fin in a first region and at least one second fin in the second region, and each of the first fin and the second fin includes a first material. A mask layer is formed on a surface of the second fin in the second region. A second material is formed on a surface of the first fin in the first region. The second material is driven into the first fin. The mask layer is removed. A first gate strip and a second gate strip are respectively formed across the first fin and the second fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of forming a FinFET device, comprising:
providing a substrate having at least one first fin, the first fin comprising a first material;
performing a transforming process to the first fin to transform a portion of the first material into a second material, and an interface between the first material and the second material is uneven; and
forming a first gate strip across the first fin.

2. The method of claim 1, further comprising performing a trimming process to narrow a width of the first fin before the transforming process.

3. The method of claim 1, further comprising performing a trimming process to narrow a width of the first fin after the transforming process.

4. The method of claim 1, wherein the transforming process comprises:
forming a transforming layer comprising the second material on a surface of the first fin; and
performing an annealing process to drive the second material into the first fin.

5. The method of claim 4, wherein the substrate further has an isolation layer covering a lower portion of the first fin, and the second material of the transforming layer is further driven toward the isolation layer.

6. The method of claim 5, wherein the first material of the first fin above the isolation layer is completely transformed into the second material.

7. The method of claim 5, wherein the first material of the first fin above the isolation layer is partially transformed into the second material.

8. A method of forming a FinFET device, comprising:
providing a substrate having at least one first fin in a first region and at least one second fin in the second region, each of the first fin and the second fin comprises a first material;
forming a mask layer on a surface of the second fin in the second region;
forming a second material on a surface of the first fin in the first region;
driving the second material into the first fin;
removing the mask layer; and
forming a first gate strip and a second gate strip respectively across the first fin and the second fin.

9. The method of claim 8, further comprising performing a trimming process to narrow a width of the first fin after forming the mask layer and before forming the second material.

10. The method of claim 8, wherein the substrate further has an isolation layer covering lower portions of the first and second fins, and the second material is further driven toward the isolation layer.

11. The method of claim 10, wherein the second material has two tailing portions in contact with the isolation layer.

12. A method of forming a FinFET device, comprising:
providing a substrate having at least one first fin in a first region, at least one second fin in a second region and an isolation layer covering lower portions of the first and second fins, wherein the first fin comprises a first material layer and a second material layer over the first material layer, and an interface between the first material layer and the second material layer is uneven;
forming a first gate strip disposed across the first fin; and
forming a second gate strip disposed across the second fin.

13. The method of claim 12, wherein the second material layer has a tailing profile toward the isolation layer.

14. The method of claim 12, wherein the second material layer has two tailing portions in contact with the isolation layer.

15. The method of claim 12, wherein the first fin above the isolation layer is constituted by the second material layer.

16. The method of claim 12, wherein the first fin above the isolation layer is constituted by the second material layer surrounding the first material layer.

17. The method of claim 12, wherein the second material layer has a uniform germanium concentration within the first fin above the isolation layer.

18. The method of claim 12, wherein the second material layer has a gradient germanium concentration within the first fin above the isolation layer.

19. The method of claim 12, wherein the first material layer comprises silicon, and the second material layer comprises silicon germanium.

20. The method of claim 12, wherein the first region is a P-type device region, and the second region is an N-type device region.

* * * * *

UNITED STATES PATENT AND TRADEMARK OFFICE
CERTIFICATE OF CORRECTION

PATENT NO.         : 10,847,426 B2                               Page 1 of 1
APPLICATION NO.    : 16/172848
DATED              : November 24, 2020
INVENTOR(S)        : Chih-Hao Wang et al.

It is certified that error appears in the above-identified patent and that said Letters Patent is hereby corrected as shown below:

On the Title Page

Item (73), should read:
Taiwan Semiconductor Manufacturing Company, Ltd., Hsinchu, (TW)

Signed and Sealed this
Second Day of February, 2021

Drew Hirshfeld
*Performing the Functions and Duties of the*
*Under Secretary of Commerce for Intellectual Property and*
*Director of the United States Patent and Trademark Office*